March 21, 1950 H. M. BACH 2,501,591

MULTIBAND SUPERHETERODYNE RADIO RECEIVER HAVING A PUSH BUTTON STATION SELECTOR

Filed Aug. 27, 1945

4 Sheets-Sheet 1

Inventor
HENRY M. BACH

By Herman L. Gordon
Attorney

March 21, 1950 H. M. BACH 2,501,591

MULTIBAND SUPERHETERODYNE RADIO RECEIVER HAVING A PUSH BUTTON STATION SELECTOR

Filed Aug. 27, 1945 4 Sheets-Sheet 2

Inventor
HENRY M. BACH

By Herman L. Gordon
Attorney

March 21, 1950

H. M. BACH 2,501,591

MULTIBAND SUPERHETERODYNE RADIO RECEIVER
HAVING A PUSH BUTTON STATION SELECTOR

Filed Aug. 27, 1945

4 Sheets-Sheet 3

Inventor
HENRY M. BACH

By Herman L. Gordon
Attorney

Inventor
HENRY M. BACH

By Herman L. Gordon
Attorney

Patented Mar. 21, 1950

2,501,591

UNITED STATES PATENT OFFICE 2,501,591

MULTIBAND SUPERHETERODYNE RADIO RECEIVER HAVING A PUSH-BUTTON STATION SELECTOR

Henry M. Bach, Woodmere, N. Y., assignor to Premier Crystal Laboratories, Incorporated, New York, N. Y.

Application August 27, 1945, Serial No. 612,931

8 Claims. (Cl. 250—20)

This invention relates to radio receiving equipment, and more particularly to radio receiving equipment of the superheterodyne type.

A main object of the invention is to provide a novel and improved method and means of radio reception wherein tuning is accomplished by very simple manual operations and wherein extreme tuning accuracy, stability, and reliability of performance is obtained.

A further object of the invention is to provide an improved method of radio receiver operation wherein tuning is accomplished of any desired signal frequency in a given band of frequencies, such as the broadcast band or a shortwave band by the manipulation of a pair of selected push button elements, each one of said pair controlling the frequency of a corresponding oscillator, and wherein the frequencies of the oscillators are mixed to provide an injection frequency, which when combined with the signal frequency, provides a predetermined intermediate frequency, the value of which is the same for any signal frequency in the band.

A still further object of the invention is to provide an improved radio receiving structure employing a plurality of crystal-controlled component oscillators whose frequencies are mixed to provide an injection frequency which is combined with a signal frequency to provide a predetermined intermediate frequency modulated by the signal, the performance of said structure being such that tuning may be accomplished over a desired band of signal frequencies.

A still further object of the invention is to provide an improved radio receiving structure adapted to be tuned to any signal frequency in a given band wherein the signal channels are separated by a predetermined channel separation frequency, said tuning being accomplished by combining a plurality of crystal-controlled oscillator frequencies to provide an injection frequency of high stability, said injection frequency "tracking" with the signal frequency and being combined therewith to provide a predetermined intermediate frequency which is also of high stability and which is subsequently amplified and demodulated by the receiver structure.

Other objects and advantages of the invention will become apparent from the following description and claims, and from the accompanying drawings, wherein:

Figure 1:
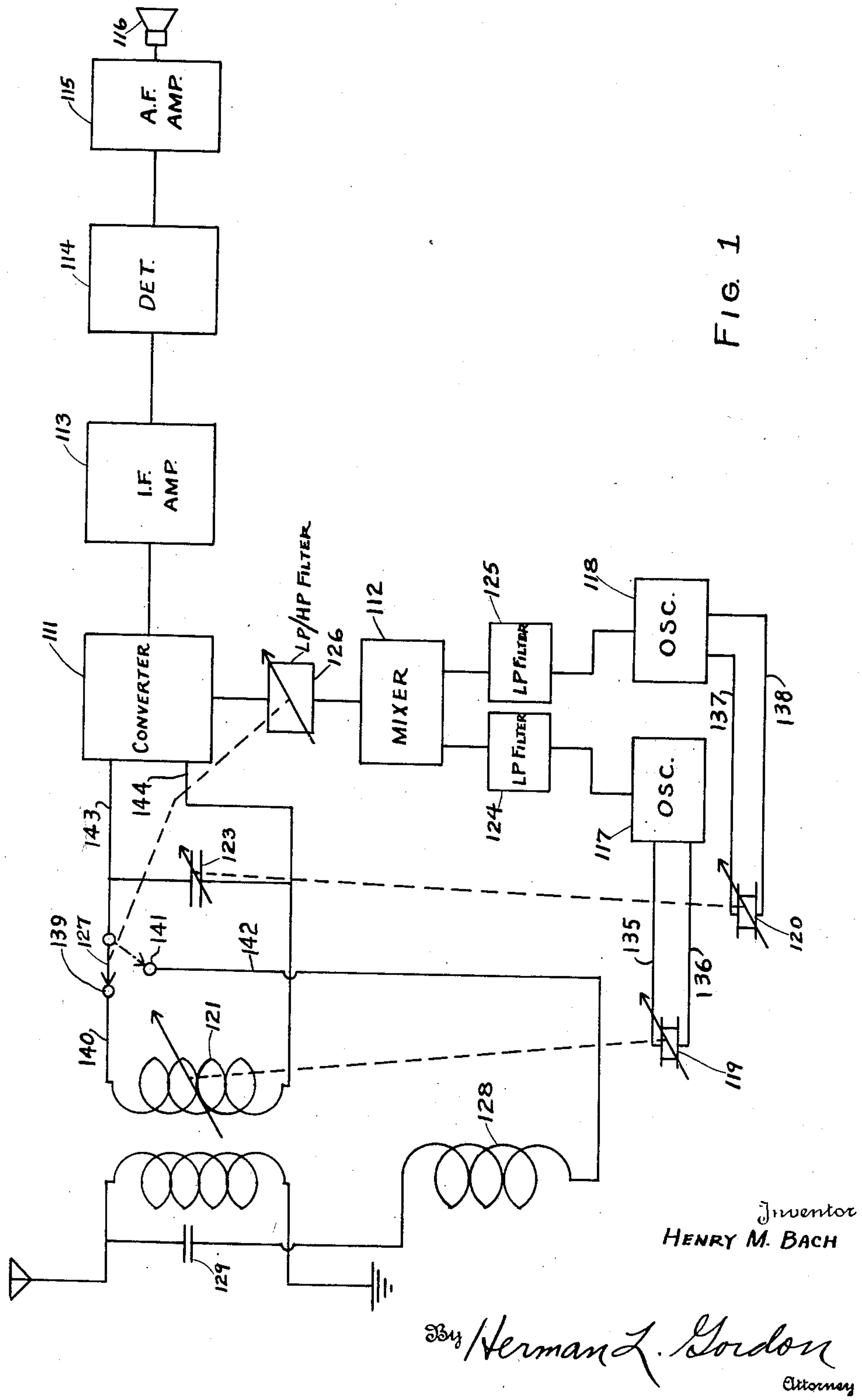
Figure 1 is a schematic block diagram illustrative of a radio receiving system constructed in accordance with and employing the method of this invention.

In the conventional superheterodyne radio receiver the oscillator is required to produce a frequency which, when mixed with the input signal frequency, produces the intermediate frequency. Ordinarily the oscillator is tuned by a first variable condenser which is ganged with another variable condenser which controls the tuning of the input stage of the receiver. The oscillator condenser must be carefully adjusted to "track" with the main tuning condenser to produce a substantially constant intermediate frequency value for all signals over the tuning band. Perfect tracking is practically impossible to obtain, so that ordinarily, compromise adjustments are made whereby the condensers are tracked at 3 points over the tuning band.

Even if the condensers are initially adjusted for satisfactory tracking, they may be subsequently affected by conditions of temperature, vibration and the like, so as to become misaligned and to thereby reduce the overall sensitivity of the receiver either at certain points in the tuning band or entirely over said band. This condition may be aggravated by further mechanical misalignment where push buttons or other mechanical devices are employed to establish the correct setting of the ganged tuning condensers, or, where no tuned input stage is employed, merely by the thermal warping or axial shifting of the plates of the oscillator condenser.

It is a common fact, therefore, that after a period of use, a superheterodyne receiver, manually operated either of the ganged condenser type or of the type employing push buttons, will lose sensitivity and selectivity, and in a majority of cases the deterioration in performance can be traced to the misalignment of the oscillator condenser.

It is a prime purpose of this invention to provide a system of tuning for a superheterodyne receiver wherein no variable oscillator condenser is employed in tuning the receiver and wherein the initial conditions for producing the correct value of intermediate frequency at the input side of the intermediate frequency amplifier are permanently maintained for all channels of a tuning band.

In the broadcast band extending from 500 kc. to 1590 kc., all transmitting stations operate on multiples of 10 kc., such as 630 kc., 710 kc., 1500 kc., etc. In tuning the receiver over this band, it is therefore only necessary to tune to multiples of 10 kc. to receive any station in the band. In the range from 500 to 1590 kc. there are 110 channels respectively separated by 10 kc. Therefore in order to tune the receiver to any station in this band it must be possible to set the oscillator or its equivalent to obtain a suitable value of frequency which will be variable at least in 10 kc. steps and which will combine with any signal frequency in the band to produce the intermediate frequency of the receiver.

It is also desirable to eliminate the possibilities of mistuning such as are inherent in the conventional condenser-tuned receiver employing either manual tuning or push-button mechanical tuning, such mistuning usually causing serious distortion. This problem has heretofore been dealt with by employing a crystal-controlled oscillator to beat with the signal frequency to produce the desired intermediate frequency value. As can be readily seen, however, 110 crystals would be required to operate the oscillator at all of the required frequencies for receiving all transmitting stations over the broadcast band, and appropriate switching means would have to be furnished for selectively connecting the crystals into the oscillator circuit. This would result in a very cumbersome arrangement.

In accordance with this invention, the number of crystals necessary to tune to all stations over a desired band is materially reduced by employing a plurality of crystal controlled oscillators in decade arrangement in place of the single oscillator heretofore employed.

Referring to Figure 1, a receiver system in accordance with this invention is shown, said system comprising a heterodyne converter 111 which receives signal-modulated carrier energy from the antenna and an injection voltage from a mixing device 112, said injection voltage being of proper frequency to combine with a predetermined signal carrier frequency to produce a fixed intermediate resultant frequency modulated by the signal. The intermediate frequency is amplified in the tuned amplifier 113 and is delivered to the detector 114 for demodulation. The demodulated signal is then amplified in audio amplifier 115 and reproduced by a speaker device 116.

The mixing device 112 receives a first voltage from an oscillator 117 and a second voltage from an oscillator 118. The frequencies of oscillators 117 and 118 are selectively controlled by crystals. The frequency of oscillator 117 is selectively controlled by a first variable crystal arrangement shown at 119 and the frequency of oscillator 118 is selectively controlled by a second variable crystal arrangement shown at 120. The control means for crystal arrangement 119 simultaneously controls the inductance of the variable secondary 121 of the input transformer for the converter 111 and the control means for crystal arrangement 120 simultaneously controls the capacitance of a variable capacitor arrangement 123 across the input conductors 143 and 144 of the converter 111. For the broadcast band, secondary 121 is controlled to tune the converter input in 100 kc. steps whereas capacitor arrangement 123 is controlled to tune the converter input in 10 kc. steps. As will subsequently be shown, crystal arrangement 119 comprises a bank of eleven crystals adapted to be selectively connected by respective conductors 135 and 136 to oscillator 117 and crystal arrangement 120 comprises a bank of ten crystals adapted to be selectively connected by respective conductors 137 and 138 to oscillator 118. The frequencies of the crystals of crystal arrangement 119 vary in 100 kc. steps and the frequencies of the crystals of crystal arrangement 120 vary in 10 kc. steps. The output of oscillator 117 may thus be regulated so as to vary in frequency in 100 kc. steps, and the output frequency of oscillator 118 may be regulated so as to vary in 10 kc. steps. The outputs of the respective oscillators 117 and 118 are fed through appropriate low pass filters 124 and 125 into mixer 112 and are heterodyned. The resultant voltage is fed to converter 111 through an adjustable filter 126. The control means for filter 126 is ganged with a band switch 127 and the control means for said filter is arranged so that when the band switch is in "broadcast" position the filter 126 acts as a low pass filter. When the band switch 127 is set for "short wave" reception, filter 126 becomes a high pass filter. In the broadcast position of band switch 127 filter 126 passes the difference frequency of oscillators 117 and 118. In the short wave position of switch 127 filter 126 passes the sum frequency of oscillators 117 and 118.

In the arrangement shown in Figure 1, provision is made for one short wave band as well as a long wave band. In the position shown, band switch 127 engages a contact 139 which is connected by a conductor 140 to the untapped end of the winding of secondary 121 and thus is set for reception of the long wave band, as above described. In the second position of band switch 127 converter 111 is connected by a switch contact 141 and conductor 142 to the antenna through a broadly-tuned coil and condenser combination comprising a coil 128 connected in series with a condenser 129, these elements being adjusted so that condenser arrangement 123 will tune the input network to approximate resonance at the center of the short wave band. The Q of the input network is made intentionally low so that excessive attenuation of the signals near the ends of the short wave band will not occur as a result of the input network being only approximately tuned to resonance. Otherwise the system functions substantially in the same manner as for the broadcast band, the sum frequencies of the oscillators 117 and 118 being employed to vary the injection voltage frequency delivered to converter 111 in 10 kc. steps over a range of 1090 kc. in the short wave region.

If extremely accurate tuning of the input circuit of converter 111 for the short wave band is desired, the same method of tuning may be employed as for the broadcast band.

Figure 2:
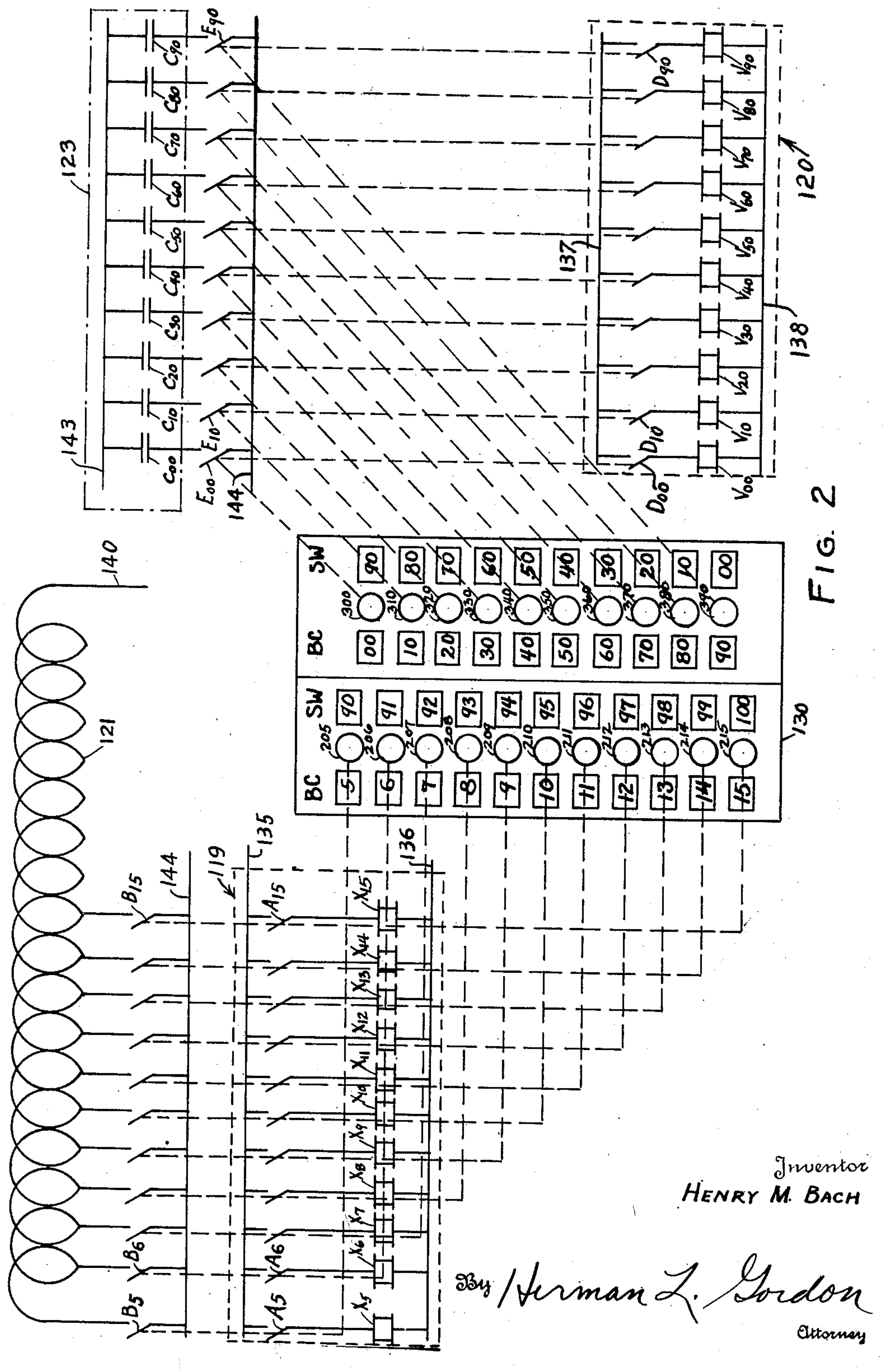
Figure 2 is a diagrammatic view of a push button panel employed in the system of Figure 1 showing the operative relationship of the push button elements of said panel with circuit controlling elements employed in said system.

Referring to Figure 2, a detailed arrangement is shown for the manual control of the tuning elements mentioned in connection with Figure 1. Mounted on a panel board 130 are two rows of conventional two-pole single-throw push button switches, there being eleven push button switches, numbered from 205 to 215 respectively in the left row and ten push button switches, numbered respectively from 300 to 390 in the right row.

The eleven push buttons 205 to 215 respectively control first, switches shown at $A_5$, $A_6$, etc., to $A_{15}$ in the circuits for a first bank of crystals indicated as $X_5$, $X_6$, etc., to $X_{15}$, differing in frequency by 100 kc., and second, switches shown at $B_5$, $B_6$, etc., to $B_{15}$, arranged to selectively connect the return conductor 144 to suitably tapped portions of the secondary 121, thereby tuning the input network of the converter 111 in corresponding 100 kc. steps.

The ten push button switches 300 to 390 respectively control first, switches shown at $D_{00}$, $D_{10}$, etc., to $D_{90}$ in the circuits for a second bank of crystals indicated as $V_{00}$, $V_{10}$, etc., to $V_{90}$, differing in frequency by 10 kc., and second, switches shown at $E_{00}$, $E_{10}$, etc., to $E_{90}$, arranged to selectively connect fixed condensers respectively indicated as $C_{00}$, $C_{10}$, etc., to $C_{90}$, to the input conductors 143 and 144, and having values selected to tune the input network of converter 111 in approximately 10 kc. steps over the broadcast band. The bank of fixed condensers and their switches correspond to variable condenser arrangement 123 of Figure 1.

Crystals $X_5$ to $X_{15}$ and their switches correspond to variable crystal arrangement 119 and crystals $V_{00}$ to $V_{90}$ and their switches correspond to variable crystal arrangement 120 of Figure 1.

A conventional mechanical arrangement is provided whereby any push-button in each row may be actuated to close its corresponding switch contacts, all other push-buttons of each row being released to maintain their switch contacts open. This enables any one of the crystals $X_6$ to $X_{15}$ to be connected to oscillator 117 and any one of the crystals $V_{00}$ to $V_{90}$ to be connected to oscillator 118 at a given time, the corresponding substantially exact antenna input circuit resonance conditions being simultaneously established for converter 111 at least for the long wave band.

As stated above, crystals $X_5$ to $X_{15}$ are separated in frequency by 100 kc. and crystals $V_{00}$ to $V_{90}$ are separated in frequency by 10 kc. The frequency of oscillator 117 can therefore be varied in 100 kc. steps and the frequency of oscillator 118 can be varied in 10 kc. steps. This enables the variation of the resultant injection frequency obtained from mixer 112 to be in 10 kc. steps over a first range extending from the difference between the frequency of the lowest crystal employed with oscillator 117, say $X_5$, and the highest crystal employed with oscillator 118, say $V_{00}$, to the difference between the highest crystal employed with oscillator 117, say $X_{15}$, and the lowest crystal employed with oscillator 118, say $V_{90}$.

The variation of said injection frequency may also be in 10 kc. steps over a second range extending from the frequency sum of the lowest crystal $X_5$ employed with oscillator 117 and the highest crystal $V_{00}$ employed with oscillator 118, to the frequency sum of the highest crystal $X_{15}$ employed with oscillator 117 and the lowest crystal $V_{90}$ employed with oscillator 118.

In a typical arrangement to cover the broadcast band of frequencies extending from 500 kc. to 1590 kc. utilizing the difference frequencies of oscillators 117 and 118, and the short wave band of frequencies extending from 9000 kc. to 10,090 kc., utilizing the sum frequencies of oscillators 117 and 118, where an intermediate frequency of 455 kc. is employed, the following crystal frequencies are employed:

| Oscillator 117 | | Oscillator 118 | |
|---|---|---|---|
| Crystal | Frequency | Crystal | Frequency |
| | Kc. | | |
| $X_5$ | 5,250 | $V_{00}$ | 4,295 |
| $X_6$ | 5,350 | $V_{10}$ | 4,285 |
| $X_7$ | 5,450 | $V_{20}$ | 4,275 |
| $X_8$ | 5,550 | $V_{30}$ | 4,265 |
| $X_9$ | 5,650 | $V_{40}$ | 4,255 |
| $X_{10}$ | 5,750 | $V_{50}$ | 4,245 |
| $X_{11}$ | 5,850 | $V_{60}$ | 4,235 |
| $X_{12}$ | 5,950 | $V_{70}$ | 4,225 |
| $X_{13}$ | 6,050 | $V_{80}$ | 4,215 |
| $X_{14}$ | 6,150 | $V_{90}$ | 4,205 |
| $X_{15}$ | 6,250 | | |

It may be readily seen from the above table that the injection frequency available at the output of mixer 112 can be made to vary in 10 kc. steps from 955 kc. to 1955 kc. utilizing the difference frequencies of oscillators 117 and 118 as above described. Subtracting the broadcast band carrier frequency, the intermediate frequency of 455 kc. is obtained at the output of converter 111 when the appropriate push buttons are actuated.

Similarly, utilizing the sum frequencies of oscillators 117 and 118 as above described, the injection frequency can be made to vary in 10 kc. steps from 9455 kc. to 10,545 kc. Subtracting the carrier frequency in the short wave band from 9000 kc. to 10,090 kc., the intermediate frequency of 455 kc. is again obtained when the appropriate push buttons are actuated.

Provided on panel 130 at one side, for example, at the left of each of push button switches 205 to 215, is a translucent window carrying a number, the numbers being from 5 consecutively to 15 corresponding to 100 kc. intervals from 500 kc. to 1500 kc. Above this row of windows the panel may carry identifying indicia such as "BC" to indicate that this row of windows is for the broadcast band. Similarly, translucent windows are provided at the left of push button switches 300 to 390, each window carrying a number, the numbers being 00 to 90 corresponding to 10 kc. intervals.

At the right of push button switches 205 to 215 are translucent windows carrying numbers from 90 consecutively to 100 corresponding to 100 kc. intervals from 9000 kc. to 10,000 kc., and at the right of push button switches 300 to 390 are translucent windows carrying numbers from 90 to 00 corresponding to 10 kc. intervals using the sum frequencies of the crystals. The right hand windows may carry identifying captions such as "SW" to indicate that these windows are for the short wave band. It will be noted that the numbering of the "SW" windows for push button switches 300 to 390 is in reverse order to the numbering for the "BC" windows. By consulting the above table it can be seen that this reversal is necessary in order to properly select the frequency indicated by the combination of numbers associated with the first row of push buttons and the second row of push buttons. Thus, to tune the system to a desired carrier frequency in the broadcast band, say 630 kc., the push button 206, adjacent the window marked "6" and the push button 330, having the window marked "30" at its left side, are depressed. This provides a crystal-controlled frequency of 5350 kc. for oscillator 117 and a crystal controlled frequency of 4265 kc. for oscillator 118. The difference frequency of 1085 kc. is derived in mixer 112 and is injected into converter 111. This injection frequency beats with the 630 kc. carrier to provide a resultant intermediate frequency of 455 kc. which carries the signal modulations, as required by the receiver.

To tune the system to a desired carrier frequency in the short wave band, say 9550 kc., the push button 210, adjacent the window marked "95," and the push button 340, adjacent the window at the right side thereof marked "50" are depressed. This provides a crystal-controlled frequency of 5750 kc. for oscillator 117 and a crystal-controlled frequency of 4255 kc. for oscillator 118. The sum frequency of 10,005 kc. is derived in mixer 112 and is injected into converter 111. This injection frequency beats with the 9550 carrier to provide a resultant intermediate frequency of 455 kc., which carries the signal modulations as required by the receiver.

Suitable lamps controlled by the actuating mechanism of band switch 127 may be provided behind the respective translucent windows to illuminate the "BC" windows when the band switch is set for broadcast reception and the "SW" windows when the band switch is set for short wave reception.

Figure 3:
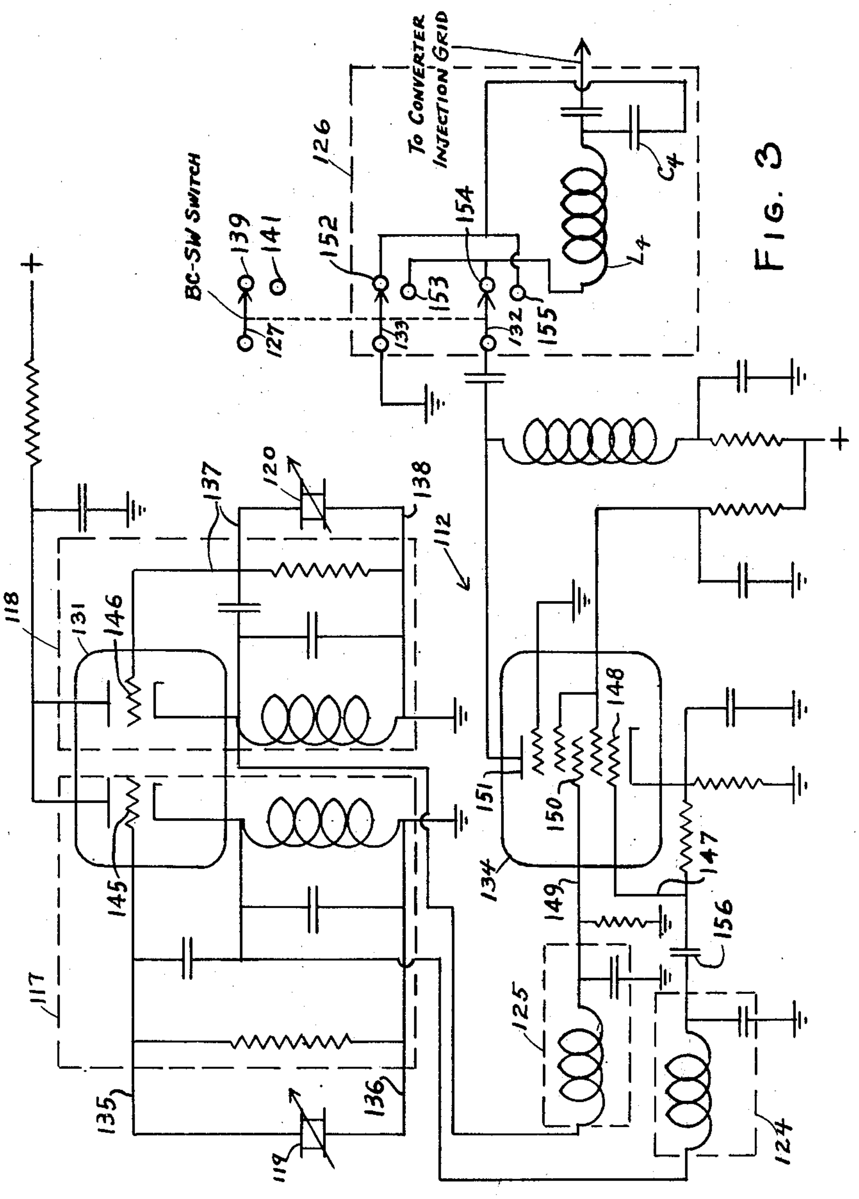
Figure 3 is a schematic circuit diagram of an oscillator arrangement in accordance with this invention adapted to be employed in the radio receiving system of Figure 1.

Figure 3 discloses, by way of example, a schematic circuit for oscillators 117 and 118 and mixer 112. A twin triode 131, which may be a type 6SN7 tube, may be employed, with one section thereof employed for each oscillator. Variable crystal arrangement 119, comprising the bank of crystals $X_5$ to $X_{15}$ shown in Figure 2, is connected by conductor 135 to the grid 145 of one section of twin triode 131 and variable crystal arrangement 120, comprising the bank of crystals $V_{00}$ to $V_{90}$ shown in Figure 2, is connected by conductor 137 to the grid 146 of the other section of twin triode 131. A low pass filter 124 is provided in the output circuit of oscillator 117 having a cut-off value of about 4500 kc. Low pass filter 124 is connected through a condenser 156 to a conductor 147 which is connected to an input grid 148 of a mixer tube 134. Another low pass filter 125 is provided in the output circuit of oscillator 118 having a cut-off value of about 6500 kc. Low pass filter 125 is connected by a conductor 149 to a second input grid 150 of mixer tube 134. A third filter 126 is coupled to the plate 151 of tube 134 and is in the output circuit of mixer 112. Filter 126 is provided with movable switch members 132 and 133 mechanically connected to wave band switch 127 and having contacts 152, 153, 154 and 155 connected with the reactance elements $L_4$ and $C_4$ of filter 126 in such a manner that in the broadcast position of band switch 127 filter 126 constitutes a low pass filter having a cut-off value of about 2500 kc., whereas in the short wave position of band switch 127 filter 126 constitutes a high pass filter having a cut-off value of about 2500 kc. Filter 126 thus selectively controls the passage of either the difference frequencies of oscillators 117 and 118 or the sum frequencies of said oscillators to the injection grid of converter 111.

Mixer 112 may comprise a pentagrid tube 134 of the 6SA7 type as shown in Figure 3.

Oscillators 117 and 118 may be conventional oscillators similar to the Pierce type.

Figure 4:
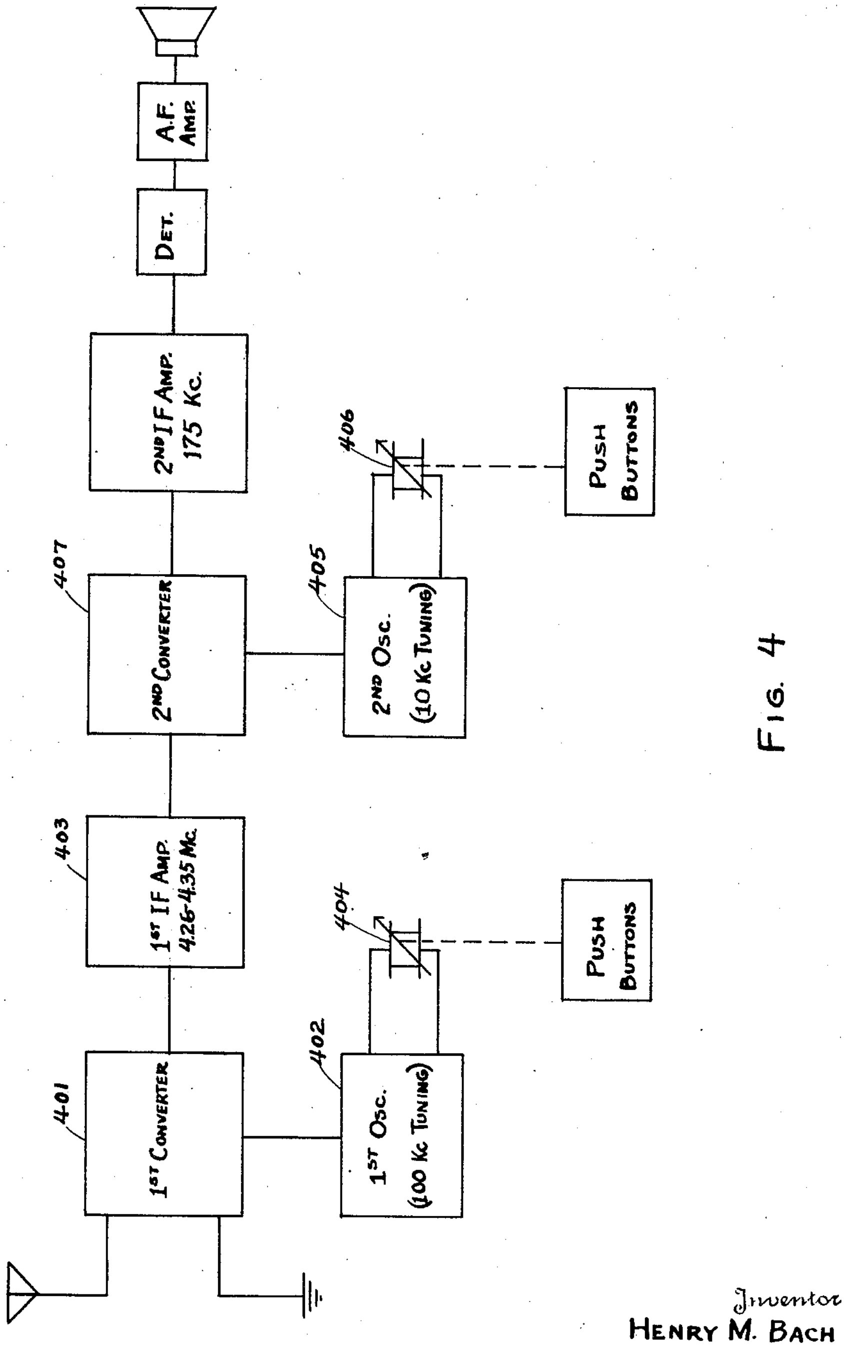
Figure 4 is a schematic block diagram illustrative of a modified radio receiving system constructed in accordance with and employing the method of this invention.

Figure 4 shows in outline form the application of the tuning system of this invention to a receiver employing two heterodyne stages. In the system of Figure 4 the signal input is heterodyned in the first converter stage 401 with a relatively high frequency crystal-controlled voltage produced by the first oscillator 402, resulting in a first intermediate frequency in the neighborhood of 4.3 megacycles. The first intermediate frequency amplifier 403 is arranged to have very low attenuation over a well defined band of frequencies ranging, say, from 4.26 to 4.35 megacycles, thus acting as a band pass filter for this band of frequencies. The first oscillator 402 is selectively controlled by a variable crystal arrangement 404 comprising a bank of eleven crystals differing in frequency by 100 kc. For tuning the system to the broadcast band of frequencies from 500 to 1590 kc. these crystals range from 4850 kc. to 5850 kc. For the band of frequencies from 500 to 590 kc., the first oscillator 402 is connected to the 4850 kc. crystal. A 500 kc. signal will beat with 4850 kc. to produce a 4.35 megacycle first intermediate frequency, whereas a 590 kc. signal will beat with 4850 kc. to produce a 4.26 megacycle first intermediate frequency. Therefore any signal between 500 kc. and 590 kc. will produce an intermediate frequency which will be passed by the first intermediate frequency amplifier 403 when the 4850 kc. crystal is connected to the first oscillator. The following table indicates the respective 100 kc. bands tuned by the first oscillator crystals:

| First Osc. Crystal Freq. | Signal |
|---|---|
| *Kc.* | *Kc.* |
| 4850 | 500 to 590 |
| 4950 | 600 to 690 |
| 5050 | 700 to 790 |
| 5150 | 800 to 890 |
| 5250 | 900 to 990 |
| 5350 | 1,000 to 1,090 |
| 5450 | 1,100 to 1,190 |
| 5550 | 1,200 to 1,290 |
| 5650 | 1,300 to 1,390 |
| 5750 | 1,400 to 1,490 |
| 5850 | 1,500 to 1,590 |

The second oscillator 405 must provide a frequency which will beat with the first intermediate frequency to accurately produce in the second converter stage 407 a second intermediate frequency of 175 kc. Since the first intermediate frequency may have any 10 kc. value between 4260 kc. and 4350 kc. the second oscillator crystal bank, indicated as variable crystal arrangement 406, must comprise a series of ten crystals differing by 10 kc. This series may begin at 4085 kc. and extend to 4175 kc. in accordance with the following table:

| Second Osc. Crystal Frequency | Last two digits of Signal |
|---|---|
| *Kc.* | *Kc.* |
| 4,085 | 90 |
| 4,095 | 80 |
| 4,105 | 70 |
| 4,115 | 60 |
| 4,125 | 50 |
| 4,135 | 40 |
| 4,145 | 30 |
| 4,155 | 20 |
| 4,165 | 10 |
| 4,175 | 00 |

It will readily be seen that tuning is accomplished in the same manner as in the embodiment of Figures 1 to 3. Thus, to tune to a 630 kc. signal, the first oscillator 402 is connected to the 4950 kc. crystal. The first oscillator frequency beats with the 630 kc. signal to produce a first intermediate frequency of 4320 kc. The 4145 kc. crystal is connected to the second oscillator 405 in accordance with the above table wherein the 4145 kc. crystal appears opposite "30," representing the last two digits of the desired channel. The 4145 kc. second oscillator frequency beats with the first intermediate frequency of 4320 to produce the desired 175 kc. second intermediate frequency voltage which carries the signal modulations.

The above described system of Figure 4 may also be employed to tune to any one of the 110 channels 10 kc. apart extending from 9110 kc. to 10,200 kc. Thus, a 9110 kc. signal will beat with the 4850 kc. crystal frequency of the first oscillator 402 to produce an intermediate frequency of 4260 kc., and a 9200 kc. signal will beat with the 4850 kc. frequency to produce an intermediate frequency of 4350 kc. Similarly, a 10,110 kc. signal will beat with the 5850 kc. crystal frequency to produce the 4260 kc. intermediate frequency and a 10,200 kc. signal will beat with said 5850 kc. crystal frequency to produce the 4350 kc. intermediate frequency. By an appropriate adjustable low pass-high pass filter ahead of the first converter 401 the system may be set for either broadcast or short wave reception. The push button panel, of course, should be provided with appropriate numerical markings adjacent the buttons for the first oscillator to indicate the respective "hundreds" of kc. for the broadcast band and for the short wave band, and the panel should be provided with appropriate markings adjacent the buttons for the respective "tens" of kc. for the broadcast band and the short wave band. The sequence of numerical markings for the "tens" buttons will be different for the short wave band than for the broadcast band.

Additional short wave channel ranges may be received by employing harmonic frequencies of the first crystal-controlled oscillator 402 which are available. For example, the second harmonics of the first oscillator will provide two additional bands, that is, employing the second harmonic of the first oscillator frequency plus or minus the first intermediate frequency, etc. When harmonics are thus employed, the push button tuning intervals are multiplied by an integer corresponding to the number of the harmonic.

While certain numerical values have been mentioned in connection with the method and elements of the specific embodiments of the invention described above, these values are merely illustrative of practical examples of the invention and are not to be construed as limiting. Other intermediate frequency values may be employed than those specified above, and of course, the crystal frequencies employed in the decade oscillators would be changed in accordance with the different intermediate frequency values employed. The new crystal frequencies could be readily calculated by one skilled in the art.

While certain specific embodiments of a method and means for receiver tuning have been disclosed in the foregoing description, it will be understood that numerous modifications within the spirit of the invention may occur to those skilled in the art. Therefore it is intended that no limitations be placed on the invention other than as defined by the scope of the appended claims.

What is claimed is:

1. Tuning means for a radio receiver comprising a first crystal-controlled oscillator, means for varying the frequency of said first oscillator in predetermined coarse steps, a second crystal-controlled oscillator, means for varying the frequency of said second oscillator in predetermined fine steps, means for combining the output voltages of said first and second oscillators to produce a resultant, and means for heterodyning said resultant with input radio frequency energy to produce a predetermined intermediate frequency voltage.

2. The structure of claim 1, and wherein said coarse steps are steps of 100 kc. and said fine steps are steps of 10 kc.

3. Tuning means for a radio receiver comprising an input device, an antenna coupled to said input device, a first crystal-controlled oscillator, means associated with said first crystal-controlled oscillator for generating predetermined crystal-controlled frequencies in 100 kc. steps, a second crystal-controlled oscillator, means associated with said second crystal-controlled oscillator for generating predetermined crystal-controlled frequencies in 10 kc. steps, means for mixing the frequencies of said first and second oscillators and combining a resultant frequency thereof with radio frequency input energy in said input device to thereby derive a predetermined intermediate frequency voltage.

4. The structure of claim 3, and wherein said mixing means includes a variable filter device mechanically linked to said input device for selecting either the difference frequencies or the sum frequencies of said first and second oscillators as said resultant frequency in accordance with the setting of said input device.

5. The structure of claim 3, and wherein said tuning means includes a first group of push buttons, each of which is adapted to select one of said 100 kc. step frequencies, and a second group of push buttons, each of which is adapted to select one of said 10 kc. step frequencies.

6. A radio receiver comprising an input device, an antenna coupled to said input device, means for tuning said input device, a first crystal-controlled oscillator, means associated with said first crystal-controlled oscillator for selectively generating a plurality of predetermined crystal-controlled frequencies in 100 kc. steps, a second crystal-controlled oscillator, means associated with said second crystal-controlled oscillator for selectively generating a plurality of crystal-controlled frequencies in 10 kc. steps, means for mixing the selected frequencies of said first and second oscillators and combining a resultant frequency thereof with tuned radio frequency energy in said input device to thereby derive a predetermined intermediate frequency voltage, and means for demodulating said intermediate frequency voltage.

7. The structure of claim 6, and wherein said mixing means includes a variable filter device mechanically linked to said tuning means for selecting either the difference frequencies or the sum frequencies of said first and second oscillators as said resultant frequency in accordance with the setting of said tuning means for the input device.

8. The structure of claim 6, and wherein a first group of push button elements is provided, each push button element of said first group being adapted to select one of said 100 kc. step frequencies, and wherein a second group of push button elements is provided, each push button element of said second group being adapted to select one of said 10 kc. frequencies, the push button elements of at least one of said groups forming part of the tuning means for said input device.

HENRY M. BACH.

REFERENCES CITED

The following references are of record in the file of this patent:

UNITED STATES PATENTS

| Number | Name | Date |
|---|---|---|
| 1,969,209 | De Kramolin | Aug. 7, 1934 |
| 2,055,737 | Terman | Sept. 29, 1936 |
| 2,151,810 | Siemens | Mar. 28, 1939 |
| 2,228,815 | Deerhake | Jan. 14, 1941 |
| 2,245,385 | Carlson | June 10, 1941 |
| 2,323,924 | Mayer | July 13, 1943 |
| 2,354,148 | Shaw | July 18, 1944 |
| 2,383,322 | Koch | Aug. 21, 1945 |

FOREIGN PATENTS

| Number | Country | Date |
|---|---|---|
| 610,570 | Germany | Mar. 13, 1935 |